United States Patent [19]

O'Regan et al.

[11] Patent Number: 5,359,190

[45] Date of Patent: Oct. 25, 1994

[54] METHOD AND APPARATUS FOR COUPLING AN OPTICAL LENS TO AN IMAGING ELECTRONICS ARRAY

[75] Inventors: Eoin P. O'Regan; Paul A. Coburn; Robert P. Nash; Pat. T. O'Donnell, all of Cork, Ireland; Peter B. Denver, Edinburgh, Scotland

[73] Assignee: Apple Computer, Inc., Cupertino, Calif.

[21] Appl. No.: 225,816

[22] Filed: Apr. 11, 1994

Related U.S. Application Data

[63] Continuation of Ser. No. 999,095, Dec. 31, 1992, abandoned.

[51] Int. Cl.5 .............................................. H01J 3/14
[52] U.S. Cl. .................................. 250/216; 250/214.1; 257/432
[58] Field of Search ............. 250/214.1, 214 R, 208.1, 250/216; 257/431, 432

[56] References Cited

U.S. PATENT DOCUMENTS

| | | | |
|---|---|---|---|
| 3,624,462 | 7/1969 | Phy | 257/778 |
| 4,410,804 | 10/1983 | Stauffer | 250/208.2 |
| 4,425,501 | 1/1984 | Stauffer | 250/216 |
| 4,553,036 | 11/1985 | Kawamura et al. | 250/208.1 |
| 4,636,631 | 1/1987 | Carpentier et al. | 250/216 |
| 4,695,719 | 9/1987 | Wilwerding | 250/216 |
| 4,733,096 | 3/1988 | Horiguchi | 358/482 |
| 5,087,961 | 2/1990 | Long et al. | 257/701 |
| 5,149,958 | 12/1990 | Hallenbeck et al. | 250/216 |

FOREIGN PATENT DOCUMENTS 9203495  4/1992  PCT Int'l Appl. .

*Primary Examiner*—David C. Nelms
*Assistant Examiner*—John R. Lee
*Attorney, Agent, or Firm*—Blakely, Sokoloff, Taylor & Zafman

[57] ABSTRACT

A method and apparatus for aligning an optical lens to the imaging array of an imaging system is disclosed. An integrated circuit die implements an imaging circuit and at least one z-height bump. An optical lens formed by injection molding has a lens portion for focusing an image onto the imaging circuit and an alignment portion for engaging the z-height bumps. A tape automated bonding tape carries the integrated circuit die and is aligned to the optical lens.

10 Claims, 9 Drawing Sheets

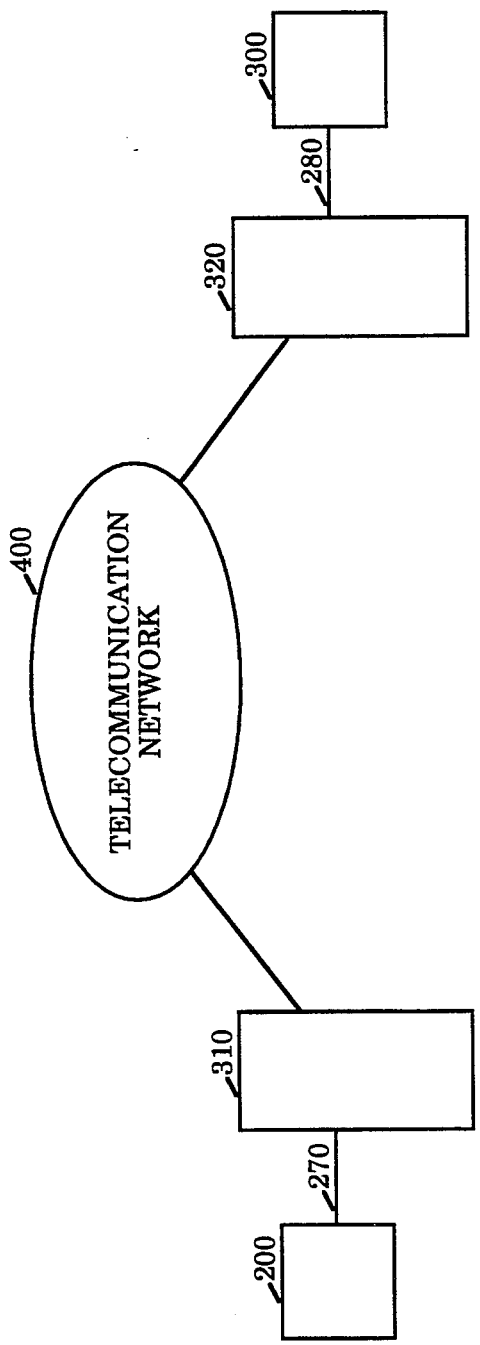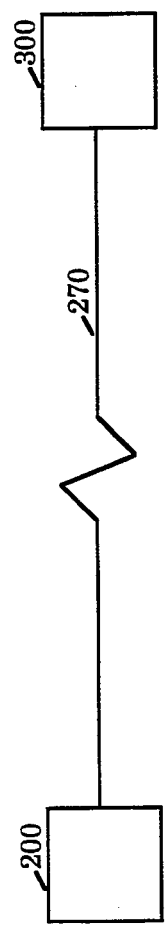
Figure 8a
Figure 8b

METHOD AND APPARATUS FOR COUPLING AN OPTICAL LENS TO AN IMAGING ELECTRONICS ARRAY

This is a continuation of application Ser. No. 07/999,095, filed Dec. 31, 1992 now abandoned.

BACKGROUND OF THE INVENTION

1. Field of the Invention

This invention relates to the field of video imaging systems. More particularly, this invention relates to methods and apparatus for coupling an optical lens to the optical sensing area of an imaging system.

2. Art Background

A typical video imaging system is comprised of an optical lens system and an integrated circuit die mounted on a printed circuit board. The integrated circuit die implements the imaging electronics. The optical lens system focuses an image scene onto the imaging array. The imaging array generates imaging signals that indicate the contents of the image scene received by the imaging array. Usually, an external circuit receives the imaging signals from the imaging array and generates the video signals.

Typically, the integrated circuit die is bonded into a chip carrier with an adhesive layer, and the chip carrier is bonded to the printed circuit board with an adhesive layer. A set of signal leads provide electrical coupling between the integrated circuit die and the printed circuit board. The optical lens is usually coupled to an optical lens assembly. The optical lens assembly is typically coupled to a threaded insert of a mounting structure.

However, the adhesive layers between the chip carrier and the printed circuit board, and between the integrated circuit die and the chip carrier usually have variable thickness and flatness. The variable thickness and flatness of the adhesive layers, plus the tolerance of the chip carrier, distorts the spacing between the optical lens and the integrated circuit die, thereby causing substantial manufacturing variation. Moreover, the x-y alignment of the integrated circuit die to the optical lens assembly is subject to similar manufacturing variation.

As a consequence, such a prior video imaging system must be calibrated after manufacture to properly focus an image scene on to the imaging array of the integrated circuit die. Typically, the alignment between the optical lens and the integrated circuit die is calibrated by rotating the optical lens assembly inside the threaded insert.

Unfortunately, the mechanisms required in prior imaging systems to calibrate the optical lens assembly results in bulkier and more expensive imaging systems, and increased manufacturing; costs for such systems. Moreover, the additional manufacturing steps required to calibrate the optical lens assembly increases manufacturing costs. In addition, the calibrated optical lens assembly is vulnerable to external forces that can throw the system out of calibration.

As will be described, the present invention is a method and apparatus for coupling an optical lens to the imaging array of an imaging system that eliminates the need to calibrate the optical lens. The method and apparatus enables high volume low-cost automated manufacturing of imaging systems.

SUMMARY OF THE INVENTION

The present invention is a method and apparatus for coupling an optical lens to the imaging array of an imaging system. The method and apparatus provides for low cost manufacture of imaging systems by eliminating the need for calibrating the lens system for alignment to the imaging electronics.

An imaging apparatus comprises a tape automated bonding (TAB) layer and a molded optical lens. The TAB layer comprises a TAB tape and an integrated circuit die. The Integrated circuit die comprises an imaging circuit and at least one z-height bump. The molded optical lens has a lens portion for transferring an image onto the imaging circuit, and an alignment portion for engaging the z-height bumps.

The alignment portion of the molded optical lens comprises at least one z-height foot for engaging the z-height bumps. For one embodiment, the z-height bumps are formed by a gold bumping process.

The alignment portion of the molded optical lens further comprises at least one x-y alignment pin. The TAB tape comprises at least one x-y alignment hole for receiving the x-y alignment pins.

The x-y alignment of the optical lens is determined by the locations of the x-y alignment holes in relation to the TAB tape, and by the locations of the x-y alignment pins in relation to the lens. The tolerances on the locations of the x-y alignment holes, and the tolerances on the locations of the x-y alignment pins are both sufficiently controlled to eliminate tile need for alignment of the optical lens in the x-y direction.

The critical distance between the optical lens and the upper surface of the integrated circuit die is determined by the distance from the lens portion of the optical lens to the z-height bumps ($H_1$), and by the height of the z-height bumps ($H_2$). The tolerances of $H_1$ and $H_2$ are sufficiently controlled to obviate the need for lens adjustment in the z direction.

BRIEF DESCRIPTION OF THE DRAWINGS

FIGS. 8a-8b illustrates communication systems that enables real-time integrated audio and video communication between computer systems that implement the teachings of the present invention.

DETAILED DESCRIPTION OF THE INVENTION

A method and apparatus is disclosed for aligning an optical lens to the imaging array of an imaging system. In the following description, for purposes of explanation, specific applications, numbers, materials and configurations are set forth in order to provide a thorough understanding of the present invention. However, it will be apparent to one skilled in the art that the present invention may be practiced without these specific details. In other instances well known systems are shown in diagrammatical or schematic form in order to not obscure the present invention unnecessarily.

Figure 1:
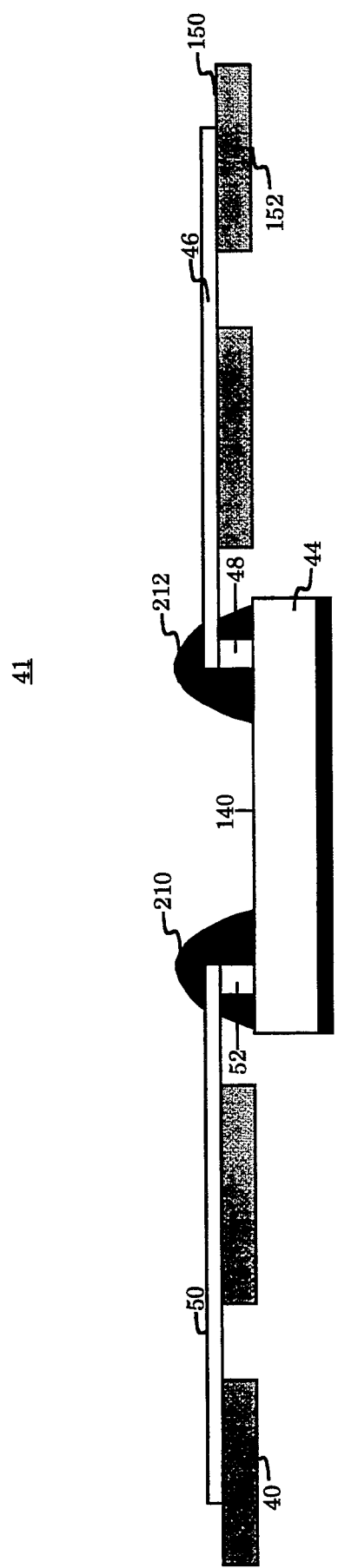
FIG. 1 is a side view of a tape automated bonding (TAB) layer which comprises a section of a TAB tape and an integrated circuit die.

Referring now to FIG. 1 a side view of a tape automated bonding (TAB) layer 41 is illustrated. The TAB layer 41 corresponds to a section of a TAB tape 40. The TAB layer 41 includes an integrated circuit die 44. The integrated circuit die 44 implements an imaging array on an upper surface 140, as well as imaging electronics. For one embodiment, the imaging array of tile integrated circuit die 44 is an array of photo diodes. Alternatively, the imaging array can be a CCD imaging array.

The TAB tape 40 carries multiple signal and power leads corresponding to the integrated circuit die 44, such as leads 46 and 50. For one embodiment, the TAB tape 40 is a polyimide tape, and the leads 46 and 50 are positioned on a top surface 150 of the TAB tape 40. Alternatively, the leads may be positioned on a lower surface 152 of the TAB tape 40.

The leads 46 and 50 enable electrical coupling between the integrated circuit die 44 and circuitry implemented on a printed circuit board (not shown). For one embodiment, the leads 46 and 50 are copper fingers. Alternatively, the leads 46 and 50 can be constructed of a wide variety, of metals or other conductive materials.

The integrated circuit die 44 has multiple bumps, such as a pair of bumps 48 and 52. The bumps 48 and 52 are for electrical coupling to the leads 46 and 50. The bumps may also be referred to as signal pads or bumped bond pads. The bumps are formed on the upper surface 140 along two opposing edges of the integrated circuit die 44. As described fully below, the remaining two edges of the integrated circuit die 44 implement height reference structures for an optical lens.

For one embodiment, the bumps 48 and 52 are formed by a gold bumping process. Alternatively, the bumps 48 and 52 may be formed on the leads 46 and 50.

To form the TAB layer 41, the integrated circuit die 44 is fabricated, and the bumps 48 and 52, as well as the height reference structures are formed on the upper surface 140. Thereafter, an inner lead bonding technique is employed to register the integrated circuit die 44 to the TAB tape 40. A pair of encapsulant layers 210 and 212 are formed to protect the interconnect between the leads 46 and 50 and the bumps 48 and 52.

Figure 2:
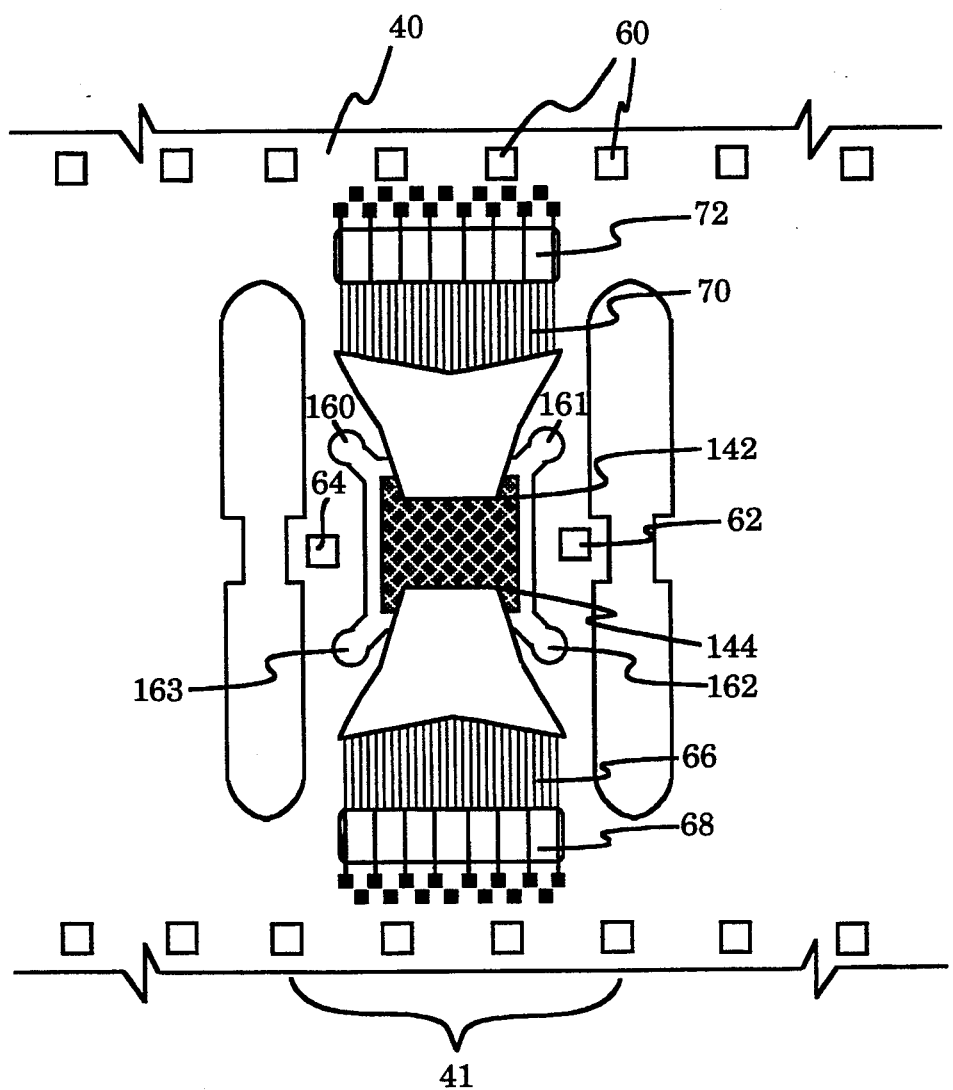
FIG. 2 is a top view of the TAB layer which shows the x-y alignment holes as square shaped cutouts in the TAB tape, and which shows a set of leads coupled to the integrated circuit die.

FIG. 2 is a top view of a section of the TAB tape 40 which contains the TAB layer 41. The TAB tape 40 is fed via a series of sprocket holes 60 located along both edges of the TAB tape 40. Also shown are a pair of x-y alignment holes 62 and 64 for precisely aligning the TAB layer 41.

For one embodiment, the x-y alignment holes 62 and 64 are square shaped cutouts in the TAB tape 40. The square shaped cutouts 62 and 64 enable an interference fit with the a pair of cylindrical locating pins of an optical lens (not shown).

Each section of the TAB tape 40 carries signal and power leads for electrically coupling an integrated circuit die to a printed circuit board. For the TAB layer 41, a set of leads 66 and 70 are provided to electrically couple the integrated circuit die 44 to a printed circuit board not shown).

The leads 66 are coupled to the integrated circuit die 44 along an edge 144 of the upper surface 140. The edge 144 has a set of bumps formed on the upper surface 140 that correspond to the leads 66. Similarly, the leads 70 are coupled to the integrated circuit die 44 along an edge 142 having, corresponding bumps formed on the upper surface 140.

Each section of the TAB tape 40 has windows to enable electrical coupling of the leads to a printed circuit board. For the TAB layer 41, a window 68 enables coupling of the leads 66 to a printed circuit board (not shown), and a window 72 enables coupling of the leads 70 to the printed circuit board. The windows 68 and 72 enable electrical coupling between the integrated circuit die 44 and circuitry implemented on the printed circuit board.

Each section of the TAB tape 40 has a set of stress relieving slots for reducing stress on the leads during assembly. For the TAB layer 41, a set of stress relieving slots 160-163 are provided to reduce the stress on the outermost leads of the leads 66 and 70.

For one embodiment, a peel-off cover (not shown) is positioned over the integrated circuit die 44. The peel-off cover protects the upper surface 140 of the integrated circuit die 44 during the manufacturing process.

Figure 3:
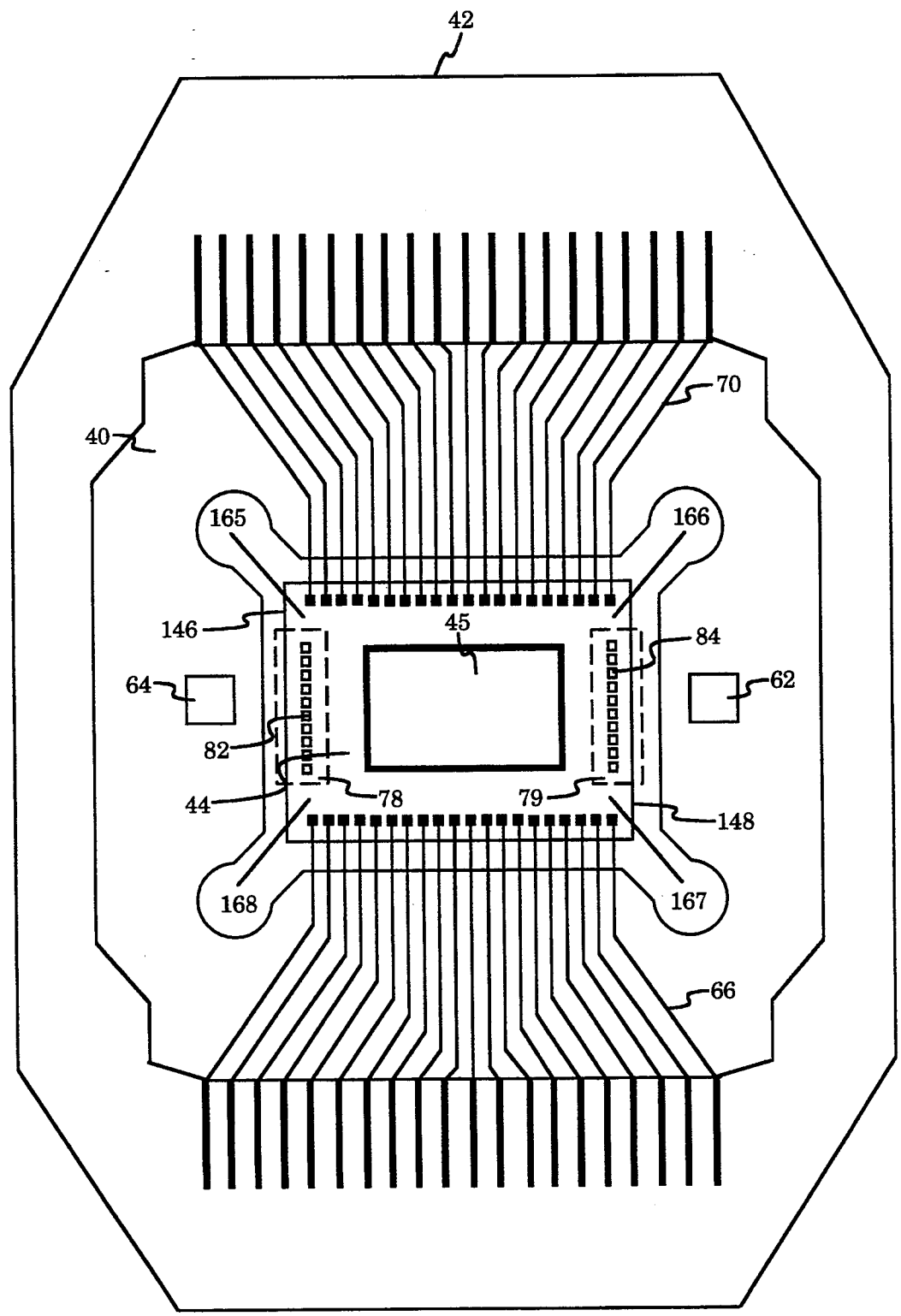
FIG. 3 shows the TAB layer excised from the TAB tape and disposed onto a printed circuit board, and shows an imaging active area of the integrated circuit die, and height reference bump structures formed on the upper surface of the integrated circuit die.

FIG. 3 shows the TAB layer 41 excised from the TAB tape 40 at the windows 68 and 72 in FIG. 2, and disposed onto a printed circuit board 42. The TAB layer 41 is excised from the TAB tape 40 before the leads 66 and 70 are heat bonded to the printed circuit board 42. Also shown is an imaging active area 45 of the integrated circuit die 44. The imaging active area 45 contains the imaging array portion of the integrated circuit die 44.

A height reference for an optical lens is provided by bump structures formed on the upper surface 140 of the integrated circuit die 44. The height reference structures are formed along edges of the integrated circuit die 44 which are not occupied by lead coupling.

For one embodiment, the height reference structures are a set of discrete z-height bumps 82 and a set of discrete z-height bumps 84. The z-height bumps 82 are formed along an edge 146, and the z-height bumps 84 are formed along an edge 148.

Alternatively, the height reference structures comprise elongated z-height bumps or bar structures. For example, one z-height bar structure can be formed along the edge 146, and another z-height bar structure can be formed along the edge 148.

The z-height bumps 82 and 84 are provided to engage a pair of z-height feet (not shown) of an optical lens to properly distance the optical lens from the imaging active area 45 of the integrated circuit die 44. The dotted line areas 78 and 79 indicate positions for the z- height feet. For one embodiment, the z-height bumps 82 and 84 are formed by a gold bumping process.

The elevation of the z-height feet by the z-height bumps 82 and 84 forms a set of air gaps 165–168 between the z-height feet and the upper surface 150. The air gaps 165–168 enable the release of moisture which may be present on the lens, or on tile integrated circuit die 44.

Figure 4:
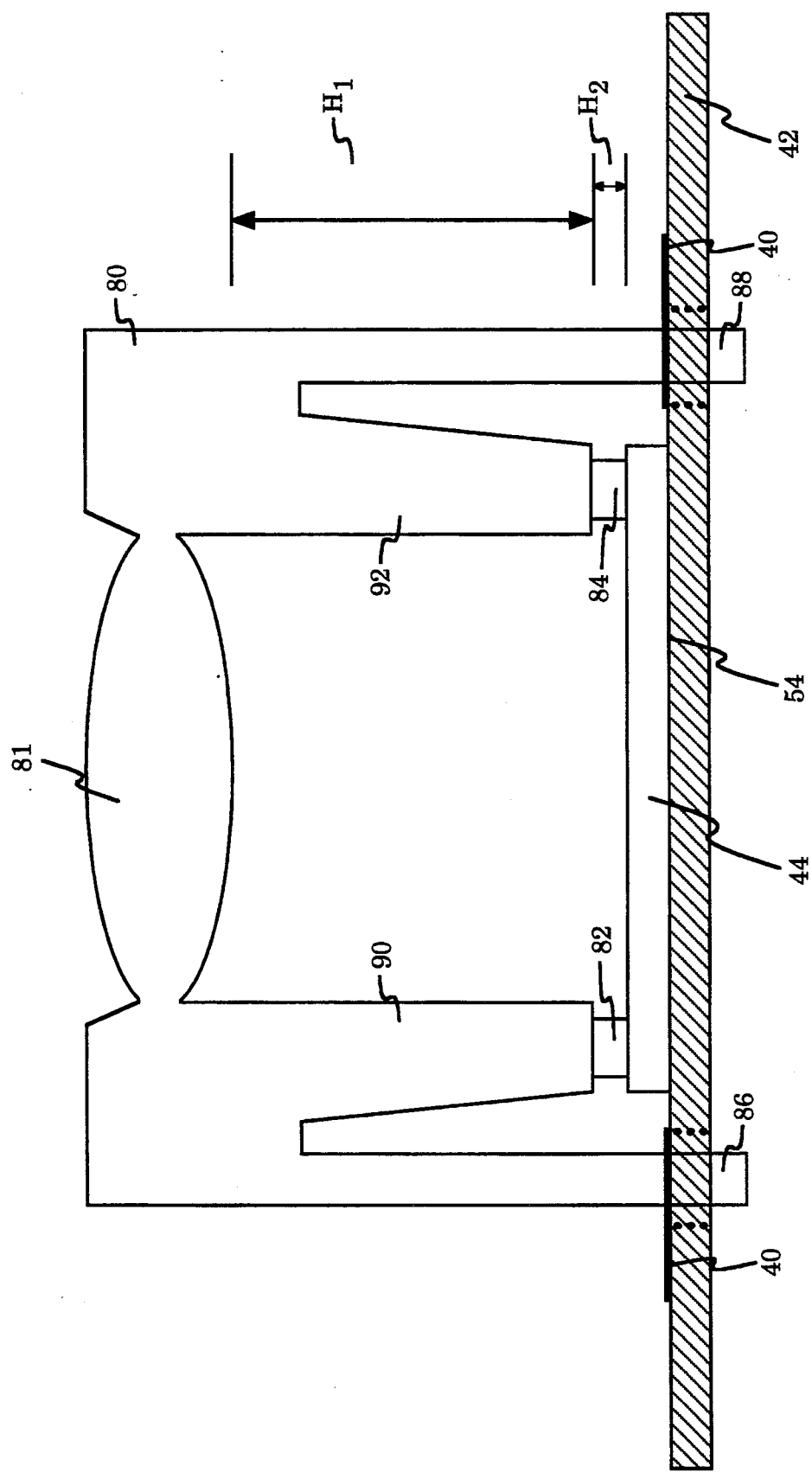
FIG. 4 is a cross sectional view of a one piece injection molded optical lens coupled to the TAB layer and the printed circuit board, wherein the optical lens is formed with a lens portion, a pair of x-y alignment pins, and a pair of z-height feet.

FIG. 4 is a cross sectional view of an optical lens 80 coupled to the TAB layer 41 and the printed circuit board 42. The optical lens 80 is a one piece rejection molded structure. The optical lens 80 is formed with a lens portion 81, a pair of x-y alignment pins 86 and 88, and a pair of z-height feet 90 and 92. The lens portion 81 transfers an image scene onto the active area 45 of the integrated circuit die 44.

The x-y alignment pins 86 and 88 and the z-height feet 90 and 92 align the optical lens 80 to the integrated circuit die 44 in relation to a three dimensional coordinate system. The three dimensional coordinate system is registered to the upper surface 150 of the integrated circuit die 44 such that the active area 45 defines a plane having a z coordinate equal to zero. The z coordinate values increase front the active area 45 toward the lens portion 81.

The x-y alignment pins 86 and 88 are force coupled into the x-y alignment holes 62 and 64 in the TAB tape 40. The x-y alignment pins 86 and 88 are coupled through clearance holes in the printed circuit board 42.

The x-y alignment of the lens portion 81 is determined by the locations of the x-y alignment holes 62 and 64 in relation to the TAB tape 40, and by the locations of the x-y alignment pins 86 and 88 in relation to the lens portion 81. The tolerances of the locations of the x-y alignment holes 62 and 64, and the tolerances in the locations of the x-y alignment pins 86 and 88 are both sufficiently controlled to eliminate the need for alignment of the optical lens 80 in the x-y direction.

The critical focal distance between the lens portion 81 and the upper surface 150 is determined by the z distance from the lens portion 81 to the z-height bumps 82 and 84, combined with the height of the z-height bumps 82 and 84. As shown, $H_1$ is the z distance between the lens portion 81 and the top of the z-height bumps 82 and 84. Also, $H_2$ is the z height of the z-height bumps 82 and 84.

The sum of $H_1$ and $H_2$ is the critical z distance for focusing an image scene onto the active area 45. The tolerances of $H_1$ and $H_2$ are sufficiently., controlled to obviate the need for lens adjustment in the z direction. As a consequence, the optical lens 80 does not require extra calibration steps during manufacture.

For one embodiment, a conductive layer is deposited between the integrated circuit die 44 and the printed circuit board 42. The conductive layer improves electrical grounding.

Figure 5:
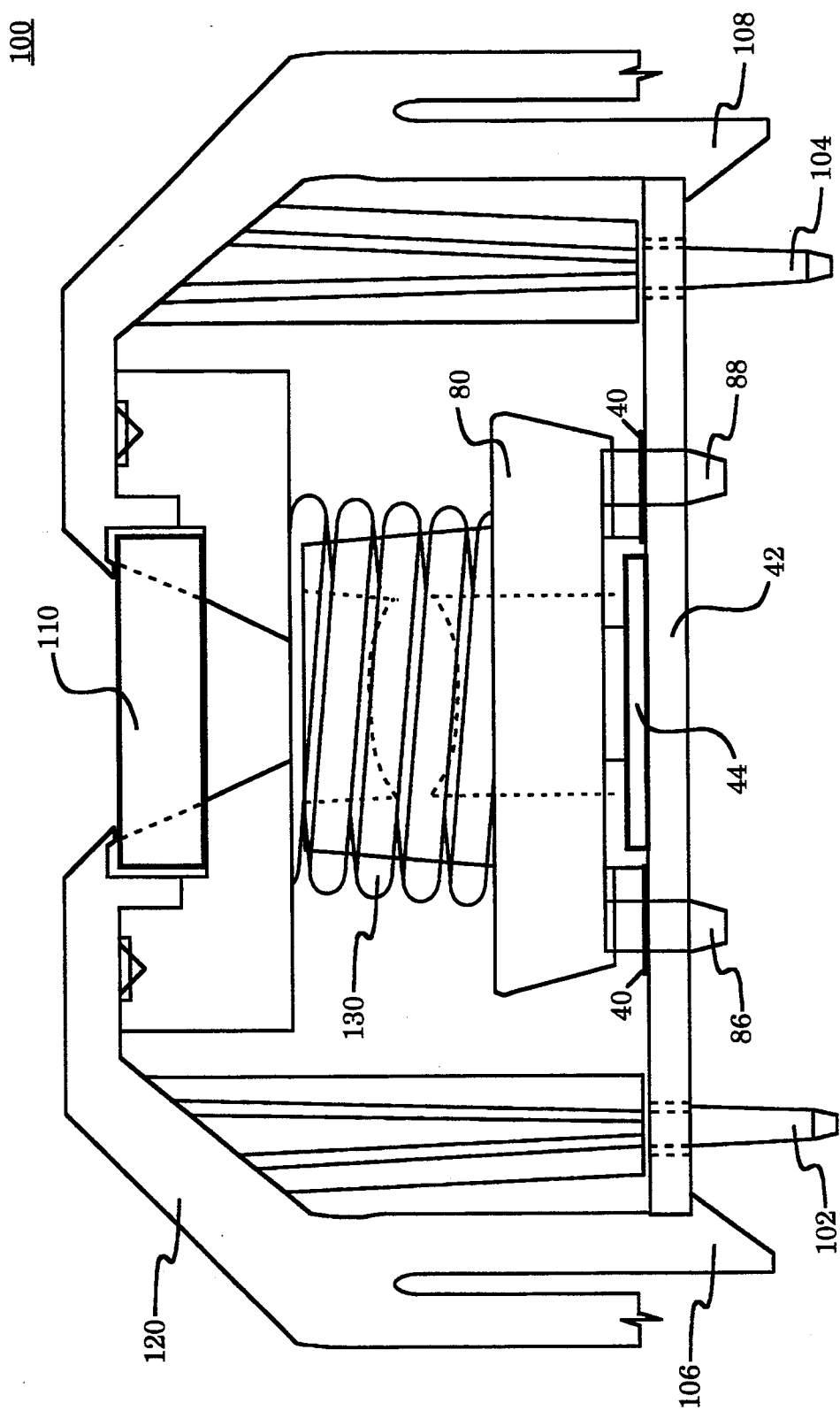
FIG. 5 illustrates an imaging system package which contains the printed circuit board, the TAB layer, and the optical lens.

FIG. 5 illustrates an imaging system package 100. The imaging system package 100 contains the printed circuit board 42, the TAB layer 41, and the optical lens 80. A plastic case 120 is coupled to the printed circuit board 42 via a pair of locating pins 102 and 104 and a pair of clips 106 and 108. A spring 130 is positioned over the optical lens 80. The spring 130 presses the optical lens 80 onto the integrated circuit die 44 through the z-height feet 90 and 92 with a reliable fixed force.

The clips 106 and 108 hold the plastic case 120 down onto the optical lens 80 through the spring 120. For one embodiment, the spring 130 is formed of stainless steel.

The plastic case 120 also provides for placement of a filter 110.

Figure 6:
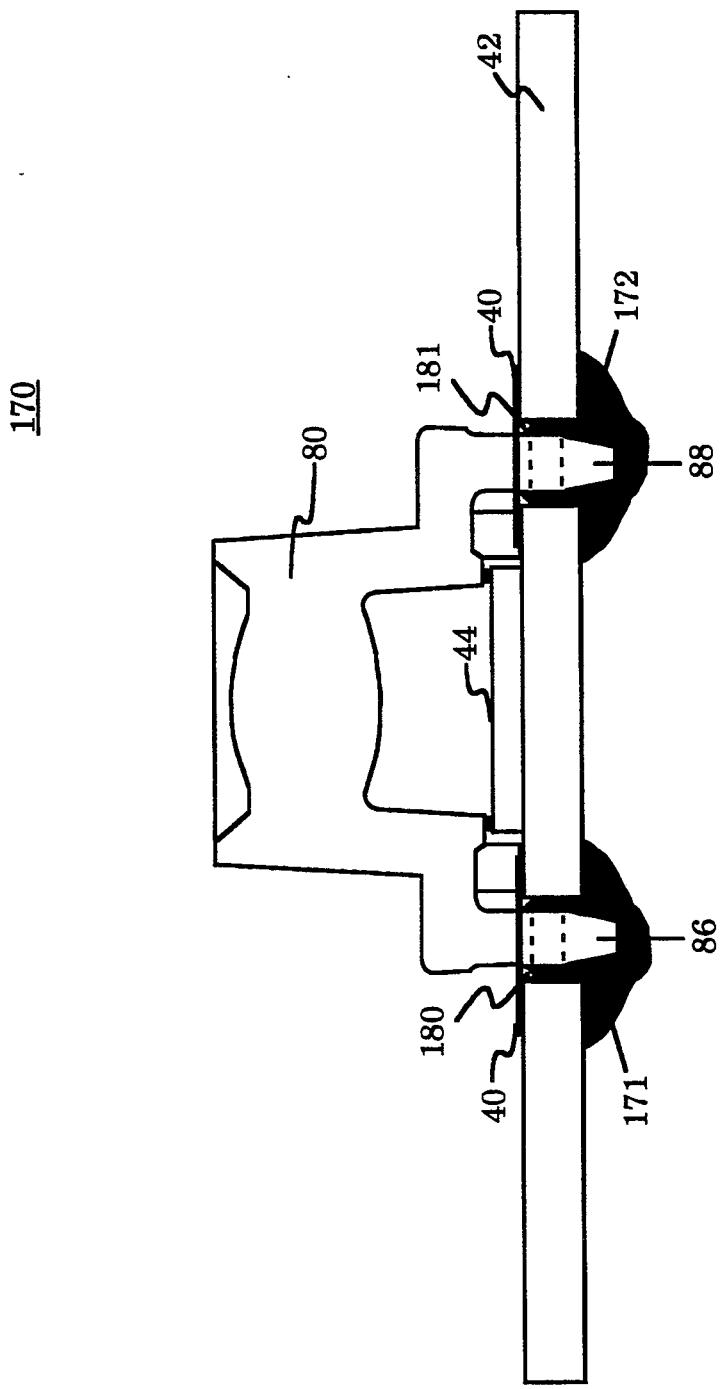
FIG. 6 illustrates an imaging system package which contains the printed circuit board, the TAB layer, and the optical lens, and which is held together by adhesive layers.
Figure 7:
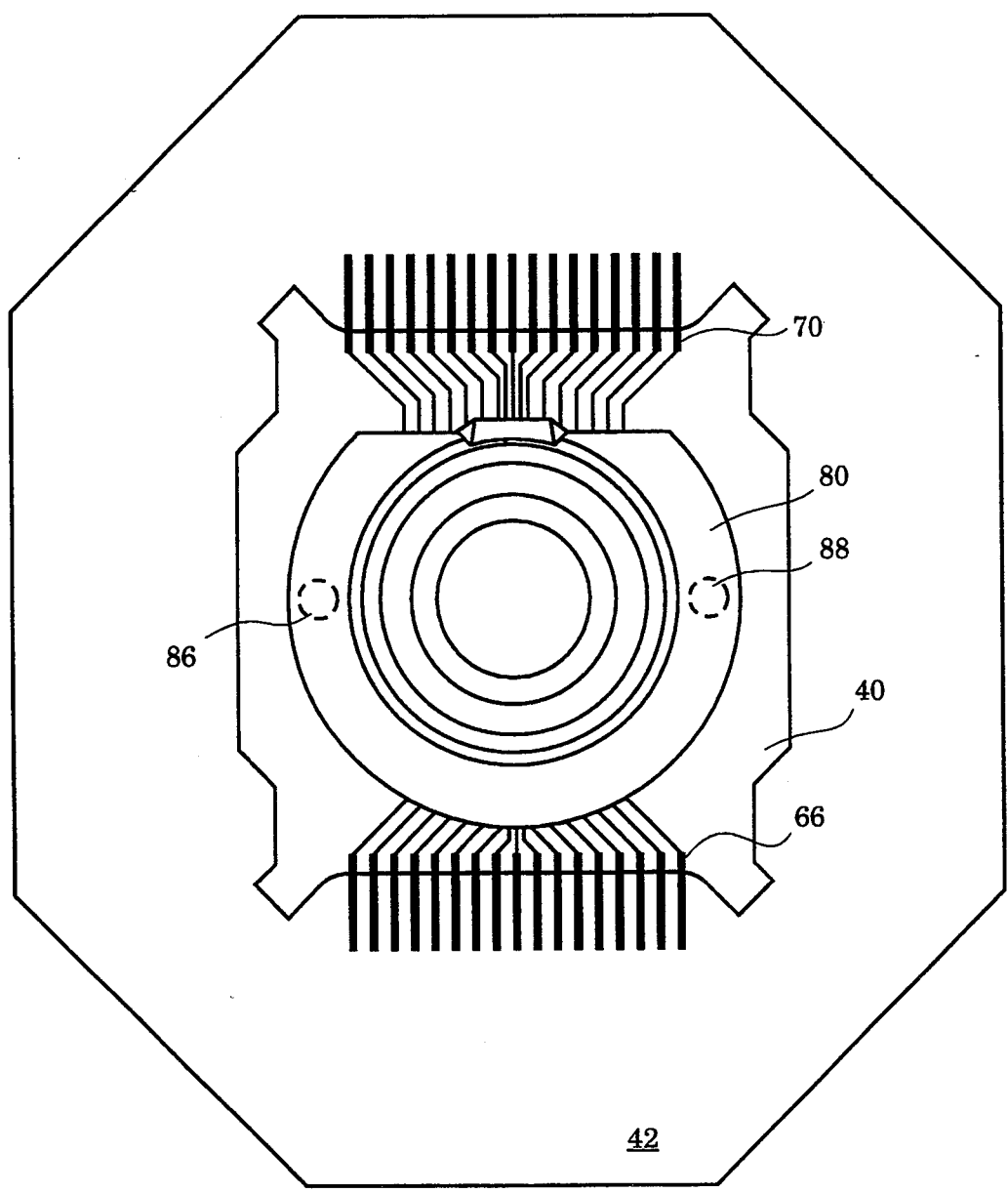
FIG. 7 illustrates a top view of the lens and PCB assembly.

FIGS. 6–7 illustrate an alternative imaging system package 170. The imaging system package 170 includes the printed circuit board 42, the TAB layer 41, and the optical lens 80. The imaging system package 170 is held together by a pair of adhesive layers 171 and 172.

The imaging system package 170 is formed by assembling the x-y alignment pins 86 and 88 through the x-y alignment holes 62 and 64 and a pair of clearance holes 180 and 181 in the printed circuit board 42. The assembly is then placed in a fixture (not shown) which applies a force between the optical lens 80 and the printed circuit board 42. The force ensures contact between the z-height feet of the optical lens 80 and the z-height bumps 82 and 84 of the integrated circuit die 44.

While in the fixture, the assembly is inverted and a fast curing adhesive is applied to form the adhesive layers 171 and 172. When the adhesive is cured, the assembly is removed from the fixture.

FIG. 8a illustrates a communication system that enables real-time integrated audio and video communication between computer and/or data processing systems that implement the teachings of the present invention. A computer or data processing system 200 and a computer or data processing system 300 each implement a video subsystem for generating and reconstructing digital video information. Also, the computer system 200 and the computer system 300 each implement an audio subsystem for generating and reconstructing audio information. An example of a data processing system is a videophone.

A communication controller 310 enables high speed communication between the computer or data processing system 200 and communication devices coupled to a telecommunication network 400 including the computer or data processing system 300. Similarly, a communication controller 320 enables high speed communication between the computer or data processing system 300 and communication devices coupled to the telecommunication network 400 including the computer or data processing system 200. For example, the telecommunication network 400 max be comprised of one or more T1 communication links and may be through metallic conductive means or optical communications means (e.g. fiber optic) or through electromagnetic waves transmitted through an atmosphere.

The communication controllers 310 and 320 represent a wide variety of communication controllers including private branch exchanges (PBXs), channel banks, as well as communication controllers that implement special packet switching communication protocols.

The computer or data processing system 200 transfers information, typically in digital format, to and from the communication controller 310 over a communication link 270, and the computer or data processing system 300 transfers information, typically in digital format, to and from the communication controller 320 over a communication link 280. For example, the communication links 270 and 280 may be T1 communication links.

FIG. 8b illustrates another communication system that enables real-time integrated audio and video communication between computer or data processing systems that implement the teachings of the present invention. The computer or data processing systems 200 and 300 each implement subsystems for generating and reconstructing audio and video information. The computer or data processing systems 200 and 300 transfer high speed information over the communication link 270. For example, the communication link 270 may be a T1 communication link.

Figure 9:
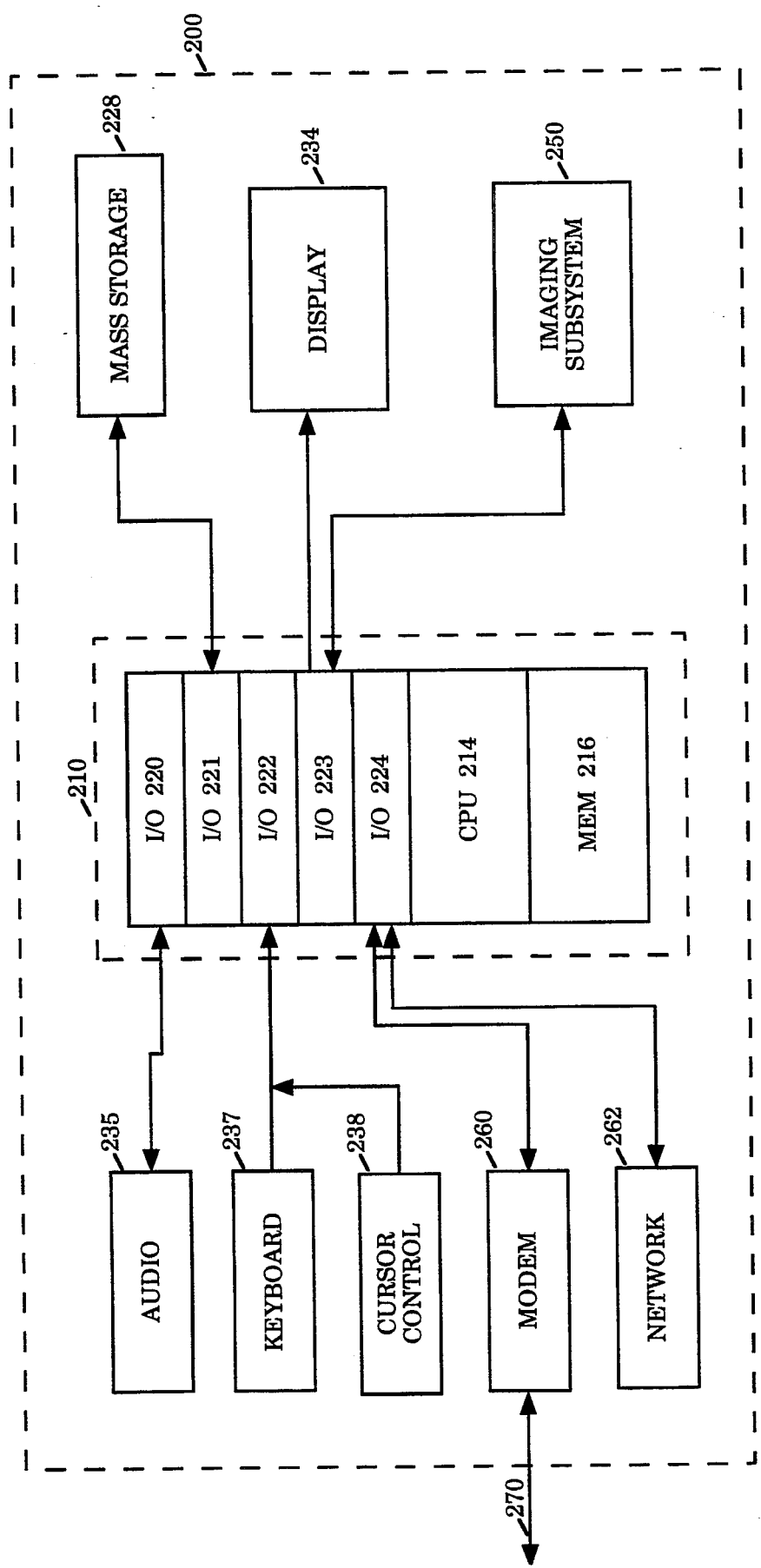
FIG. 9 illustrates a computer system which includes a processor subsystem and a variety of input/output (I/O) devices including an imaging subsystem that incorporates the teachings of the present invention.

FIG. 9 illustrates the computer or data processing system 200 which includes a processor subsystem 210, and a variety of input/output (I/O) devices including an imaging subsystem 250 that incorporates the teachings of the present invention.

The processor subsystem 210 is comprised of a set of I/O circuits 220-224, a central processing unit (CPU) 214, and a memory 216. The I/O circuits 220-224 are used to transfer information in appropriately structured form to and from other portions of the processor subsystem 210. I/O circuits, such as the I/O circuits 220-224, along with the CPU 214 and memory 216, are typically found in most general purpose computer systems. Alternatively, in the case of simple telecommunication systems such as telephones with real time video ("videophone"), processor subsystem 210 may not have all of the components shown; for example, the processor subsystem may include in this case a processing means and an input controller for receiving the image information from the imaging subsystem and transmitting the image information over a communication medium.

A mass storage device 228 is coupled to the I/O circuit 221. The mass storage device 228 represents disk units, tape units, as well as a wide variety of other mass storage devices. As is well known, the mass storage device 228 may store computer programs, characters, routines, etc., which may be accessed and executed by CPU 214. Mass storage 228 may not be incorporated in some embodiments, such as videophones.

A display device 234 is coupled to the I/O circuit 223, and is used to display images. Any well known variety of displays may be utilized as the display device 234 including displays driven by a corresponding frame buffer interface. The I/O circuit 223 may be any well known display controller. A keyboard 237 is shown coupled to the I/O circuit 222 and is used to input data and commands into the processor subsystem 210, as is well known. A cursor control device 238 is also shown coupled to processor subsystem 210 through the I/O circuit 222. Any well known variety of cursor control devices may be utilized as the cursor control device 238.

A modem 260 is coupled to the processor subsystem 210 through the I/O circuit 224. The modem 260 enables, in the well known fashion, communication between the processor subsystem 210 and other communication devices coupled to the communication link 270.

A network controller 262 is coupled to the processor subsystem 210 through the I/O circuit 224. The network controller enables communication over a computer communication network or local area network, which in turn may be coupled to other computer systems. For example, the computer communication network may be an Ethernet network.

In one embodiment of the invention, the several hardware elements discussed above are intended to represent a broad category of computer systems. Particular examples include computer systems manufactured by Apple Computer, Inc. of Cupertino, Calif. Other computer systems having like capabilities may of course be adapted in a straightforward manner to perform the functions described herein.

The imaging subsystem 250 is coupled to the processor subsystem 210 through the I/O circuit 223. The imaging subsystem 250 includes the imaging system package 100 or 170. The imaging subsystem 250 generates digitized imaging signals corresponding to image scenes sensed by the imaging system package 100 or 170. The digitized imaging signals are transferred to the processor subsystem 210 through the I/O circuit 223. It will be appreciated that the I/O circuit for the display 234 may be distinct from the I/O circuit for the image subsystem 250, such that there are actually two separate I/O circuits, one for the display 234 and another for the image subsystem 250. It will also be appreciated that the I/O circuit for receiving image information from the imaging subsystem 250 may be any one of known controllers for retrieving digitized image information from an array (e.g. storage array) containing the digitized image information.

The processor subsystem 210 assembles the image signals from the imaging subsystem 250 into outbound images typically in digital format. The processor subsystem 210 transfers the outbound images to the computer or data processing system 300 through the modem 260 and over the communication link 270. Also, the processor subsystem 210 may store the outbound images in the memory 216 or the mass storage device 228, or display the image scenes corresponding to the outbound images on the display device 234.

The computer or data processing system 200 receives inbound images, typically in digital format, from the computer or data processing system 300 over the communication link 270 through the modem 260. The processor subsystem 210 receives the inbound images through the I/O circuit 224. The processor subsystem 210 displays the image scenes corresponding to the inbound images on the display device 234. Also, the processor subsystem 210 may store the inbound images in the memory 216 or the mass storage device 228. It will be appreciated that in some videophone embodiments, the image information from the data processing will not be in digital format and thus a modem may not be required.

An audio subsystem 235 is coupled to the processor subsystem 210 through the I/O circuit 220. The audio subsystem 235 includes a microphone and a speaker. The audio subsystem 235 generates digitized audio signals corresponding to sound waves received by the microphone. The digitized audio signals are transferred to the processor subsystem 210 through the I/O circuit 220. In alternative embodiments of the data processing system (e.g. videophones) the audio subsystem 235 may include a microphone or other means for sensing audio information (e.g. sound waves) and a speaker or other means for generating audio information and an amplifier and be coupled to the communication medium (e.g. link 270) without a modem; an example of this type of audio subsystem can be found in a standard (voice) telephone.

In one embodiment, the processor subsystem 210 assembles the digitized udio signals into outbound audio data. The processor subsystem 210 transfers the outbound audio data to the computer system 300 through the modem 260 and over the communication link 270. Also, the processor subsystem 210 may store the outbound audio data in the memory 216 or the mass storage device 228.

In one embodiment the computer or data processing system 200 receives inbound audio data from the computer or data processing system 300 over the communication link 270 through the modem 260. The processor subsystem 210 receives the inbound audio data through the I/O circuit 224. The processor subsystem 210 transfers the inbound audio data to the audio subsystem 235. The audio subsystem 235 then uses the speaker to generate audio waves corresponding to the inbound audio data. Also, the processor subsystem 210 may store the inbound audio data in the memory 216 or the mass storage device 228.

In a similar manner, the computer or data processing system 200 may transfer inbound and outbound digitized images over a computer network through the network controller 262. Also, the computer system 200 may transfer inbound and outbound audio data over the computer network through the network controller 262.

In the foregoing specification, the invention has been described with reference to specific exemplary embodiments thereof. It will however be evident that various modifications and changes made be made thereto without departing from the broader spirit and scope of the invention as set forth in the appended claims. The specification and drawings are accordingly to be regarded as illustrative rather than restrictive.

What is claimed is:

1. A computer system, comprising:
   processor subsystem comprising a central processing unit and an input/output circuit;
   imaging subsystem coupled to the input/output circuit, the imaging subsystem comprising a tape automated bonding (TAB) tape, an integrated circuit die having an imaging circuit and at least one z-height bump, and an optical lens for transferring an image onto the imaging circuit and for engaging the at least one z-height bumps, the imaging subsystem generating imaging information corresponding to an image scene received by the optical lens;
   display device coupled to the input/output circuit, the display device receiving the imaging information and rendering the image scene.

2. The computer system of claim 1, further comprising mass storage device coupled to the central processing unit, the mass storage device storing the imaging information.

3. The computer system of claim 1, wherein the optical lens comprises at least one z-height foot for engaging the at least one z-height bumps.

4. The computer system of claim 3, wherein the optical lens further comprises at least one x-y alignment pin.

5. The computer system of claim 4, wherein the TAB tape comprises at least one x-y alignment hole for receiving the x-y alignment pins.

6. The computer system of claim 5, wherein the imaging subsystem further comprises a printed circuit board having at least one clearance alignment hole for receiving the x-y alignment pins.

7. The computer system of claim 6, wherein the TAB tape carries a plurality of leads for providing electrical coupling between the integrated circuit die and the printed circuit board.

8. The computer system of claim 7, wherein the integrated circuit die further comprises a plurality of bumps for electrically coupling to the leads.

9. The computer system of claim 8, wherein the imaging subsystem further comprises housing structure for pressing a spring down onto the optical lens, the spring holding the optical lens onto the integrated circuit die.

10. The computer system of claim 8, wherein the optical lens is held onto the integrated circuit die by an adhesive placed in the clearance alignment holes receiving the x-y alignment pins.

* * * * *